United States Patent [19]

Okada et al.

[11] Patent Number: 5,392,270
[45] Date of Patent: Feb. 21, 1995

[54] INFORMATION RECORDING REPRODUCING APPARATUS USING DATA CONVERSION TO PROVIDE FOR ACCURATE REPRODUCTION OF HIGH DENSITY RECORDING USING AN OPTICAL RECORDING MEDIUM

[75] Inventors: Shinichi Okada; Kyota Funamoto, both of Tokorozawa, Japan

[73] Assignee: Pioneer Electronic Corporation, Tokyo, Japan

[21] Appl. No.: 254,433

[22] Filed: Jun. 6, 1994

Related U.S. Application Data

[63] Continuation of Ser. No. 914,528, Jul. 17, 1992, abandoned.

[30] Foreign Application Priority Data

Jan. 21, 1992 [JP] Japan .................................. 4-008605

[51] Int. Cl.$^6$ .............................................. G11B 7/00
[52] U.S. Cl. ...................................... 369/59; 369/124; 341/67
[58] Field of Search .................. 369/59, 58, 54, 53, 369/42, 48, 124, 60; 341/50, 58, 59, 68, 88, 55; 360/47, 48, 50, 49, 51, 67, 40, 39, 42

[56] References Cited

U.S. PATENT DOCUMENTS

| | | | |
|---|---|---|---|
| 4,484,176 | 11/1984 | Fitzpatrick | 341/59 |
| 4,584,616 | 4/1986 | Allen | 360/50 |
| 4,833,471 | 5/1989 | Tokuume et al. | 341/67 |
| 4,866,692 | 9/1989 | Saito et al. | 369/59 |

*Primary Examiner*—Aristotelis Psitos
*Assistant Examiner*—Muhammad N. Edun
*Attorney, Agent, or Firm*—Sughrue, Mion, Zinn, Macpeak & Seas

[57] ABSTRACT

Disclosed is an information recording/reproducing apparatus using an optical recording medium, which can reproduce information from a recording medium designed to have a high linear recording density, by a method of performing signal separation/extraction by one threshold level in a level detecting process at the time of information reproduction from an optical recording medium with a high linear recording density. The information recording apparatus comprises a data converting means for perform data conversion on record information consisting of a digital signal in accordance with a predetermined data conversion table including a pattern for yielding a converted pattern consisting of at least one "0" and an even number of consecutive "1" or a converted pattern having a section consisting of "01010" and a section consisting of at least one "0" or an even number of consecutive "1"; a data modulating means for inverting an initial output signal when bit information of data after the data conversion is "1" given that the initial output signal is "0"; and a recording means for recording the output signal on an optical recording medium. The information reproducing apparatus comprises a reading means for reading information from the optical recording medium to yield a reproduced signal; a level detecting means for detecting a level of the reproduced signal and outputting digital data; an error correcting means for, upon detection of a sequence of "01110" in a bit pattern of the digital data, correcting the sequence to a sequence of "01010" and outputting corrected data, and, upon detection of no error, outputting the digital data; and a data reverse converting means for performing reverse conversion on the output data of the error correcting means in accordance with the data conversion table, yielding reproduced information.

2 Claims, 4 Drawing Sheets

INFORMATION RECORDING REPRODUCING APPARATUS USING DATA CONVERSION TO PROVIDE FOR ACCURATE REPRODUCTION OF HIGH DENSITY RECORDING USING AN OPTICAL RECORDING MEDIUM

This is a continuation of application Ser. No. 07/914,528, filed Jul. 17, 1992, now abandoned.

BACKGROUND OF THE INVENTION

1. Field of the Invention

The present invention relates to an information recording/reproducing apparatus using an optical recording medium such as an optical disk.

2. Description of the Related Art

Recording and reproducing systems for an optical disk can be considered as a kind of low-pass filters in view of the OTF (Optical Transfer Function) of an objective lens and the response characteristic or the like of a recording material. If information is recorded with a high linear recording density increased to near the upper limit of the frequency response of the recording and reproducing systems, a read error occurs due to a so-called code interference by which reproduced waveforms are likely to interfere with each other at the time adjacent marks are read.

Suppose a train of signals "0,1,1,0,1" is input while considering the recording and reproducing systems for an optical disk as a single transfer path. If an input "1" is a pulse with a level of "1", the train of signals "0,1,1,0,1" is the input signal as shown in FIG. 1. The output shown in FIG. 1 is acquired in accordance with this input signal. The signal indicated by the solid line is output first according to the first input pulse, the signal indicated by the broken line is then output according to the next input pulse, and the signal indicated by the alternate long and short dash line is output according to the last input pulse. The final output therefore becomes the sum of the former two outputs as indicated by the alternate long and two short dashes line. The acquired train of output signals, "0,1,2,1,1", differs from the train of input signals.

Because of the above characteristic, with a high linear recording density accomplished, the recording and reproducing systems for an optical disk can be said to be approximated to a PR (1,1) transfer path (Partial Response Transfer Path) as shown in FIG. 2. The PR (1,1) transfer path shows a characteristic such that, when a train of input signals has a digitized value, the output has a ternary value.

Conventionally, therefore, by using a method of ternary detection while considering the recording and reproducing systems for an optical disk is considered as a PR (1,1) transfer path, information recording and reproduction on and from an optical disk designed to have a high linear recording density are accomplished by apparatuses having structures as shown in FIGS. 3 and 4.

FIG. 3 illustrates the structure of a conventional information recording apparatus for an optical disk.

In recording information, record information digitized to have values "0" and "1" is supplied to a precoder 1. The precoder 1 modulates data before inputting the data to the PR (1,1) transfer path, and is equivalent to a transfer path which processes input data with the opposite characteristic to that of the PR (1,1) transfer path, as shown in FIG. 5. The output of the precoder 1 is supplied via a digitizer 2 to an optical head 3. The digitizer 2 digitizes other values than "0" and "1" which are produced by the precoder 1, and may be designed to divide an input value by "2" and output the remainder. The optical head 3 performs photoelectric conversion on the output of the digitizer 2 and records the resultant signal on an optical disk which is rotated by a spindle motor 4. It is known that the precoder 1 and digitizer 2 have a so-called NRZi modulation (Non Return to Zero Inverting) function that inverts the level of an output signal when an input signal is "1". The record information is therefore considered to be supplied to the optical head 3 via an NRZi modulator 6, which comprises the precoder 1 and the digitizer 2.

FIG. 4 illustrates the structure of a conventional information reproducing apparatus for an optical disk.

In reproducing information, an optical pickup 7 accesses the optical disk 5 for information reading, yielding a reproduced signal. The reproduced signal is amplified by an equalizer amplifier 8 before it is supplied to a level detector 9. The level detector 9 digitizes the ternary reproduced signal to restore it to the original record information and outputs the reproduced information. The process the optical pickup 7 performs to read information from the optical disk 5 is equivalent to the PR (1,1) transfer path due to the code interference. The reproduced signal therefore is a ternary signal having values of "0", "1"and "2". The level detector 9 compares the level of the signal from the equalizer amplifier 8 with first and second threshold levels. The level detector 9 is designed to output "0" when the level of the signal from the equalizer amplifier 8 is lower than the first threshold level or equal to or higher than the second threshold level, and output "1" when the level of that signal is equal to or higher than the first threshold level and lower than the second threshold level.

In short, the conventional recording and reproducing systems for an optical disk designed to have a high linear recording density should separate and extract a ternary signal using two threshold levels. This separation/extraction of a signal accurately converted to have three values requires a higher S/N ratio in the reproduced signal than the separation and extraction of a digital signal by a single threshold level, and is therefore practically difficult to accomplish.

SUMMARY OF THE INVENTION

It is therefore an object of the present invention to provide an information recording/reproducing apparatus using an optical recording medium, which does not have the aforementioned shortcoming and can thus reproduce information from a recording medium designed to have a high linear recording density, by a method of performing signal separation/extraction by one threshold level in a level detecting process at the time of information reproduction.

An information recording apparatus using an optical recording medium according to the present invention comprises a data converting means for performing data conversion on record information consisting of a digital signal in accordance with a predetermined data conversion table including a pattern for yielding a converted pattern consisting of at least one "0" and an even number of consecutive "1" or a converted pattern having a section consisting of "01010" and a section consisting of at least one "0" or an even number of consecutive "1"; a data modulating means for inverting an initial output signal when bit information of data after the data conversion is "1" given that the initial output signal is "0" (NRZI modulation); and a recording means for recording the output signal on an optical recording medium.

An information reproducing apparatus using an optical recording medium according to the present invention comprises a reading means for reading information from the optical recording medium to yield a reproduced signal; a level detecting means for detecting a level of the reproduced signal and outputting digital data; an error correcting means for, upon detection of a sequence of "01110" in a bit pattern of the digital data, correcting the sequence to a sequence of "01010" and outputting corrected data, and, upon detection of no error, outputting the digital data; and a data reverse converting means for performing reverse conversion on the output data of the error correcting means in accordance with the data conversion table, yielding reproduced information.

DETAILED DESCRIPTION OF THE PREFERRED EMBODIMENT

In an information recording/reproducing apparatus using an optical recording medium according to the present invention, the information recording apparatus performs data conversion in such a way that "1" does not appear three or more times in a row in a train of information data at the time of recording information data on a recording medium, and the information reproducing apparatus restores the data converted by this data conversion to the original information data.

A preferred embodiment of the present invention will be described below referring to the accompanying drawings.

Figure 1:
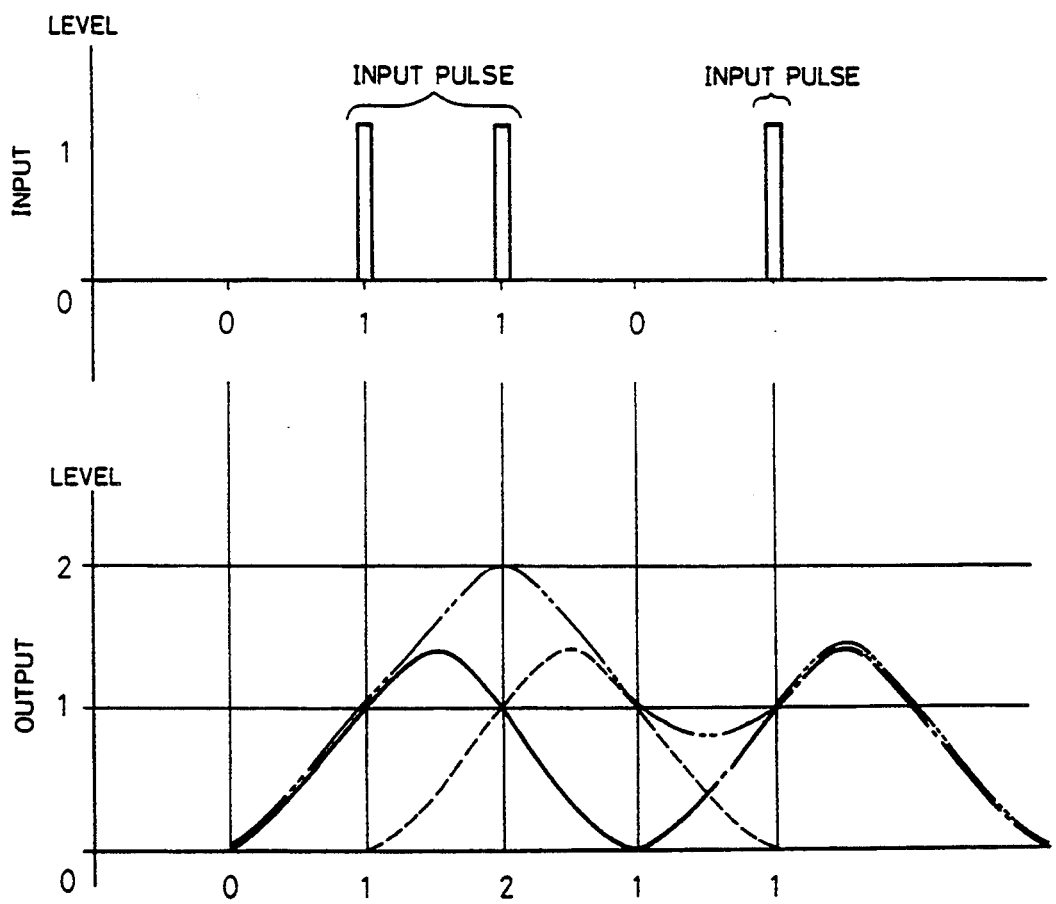
FIG. 1 is a diagram illustrating a data reading error caused by code interference.
Figure 2:
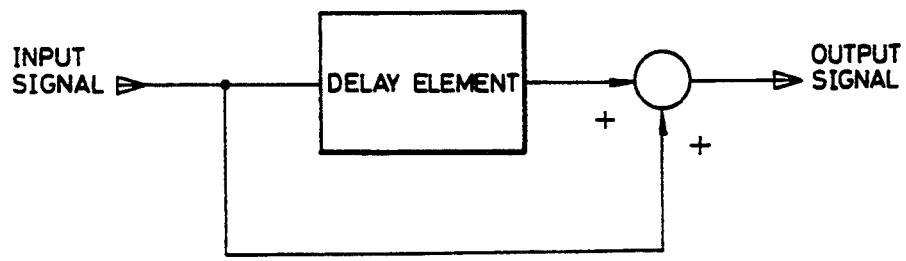
FIG. 2 shows a PR (1,1) transfer path.
Figure 3:
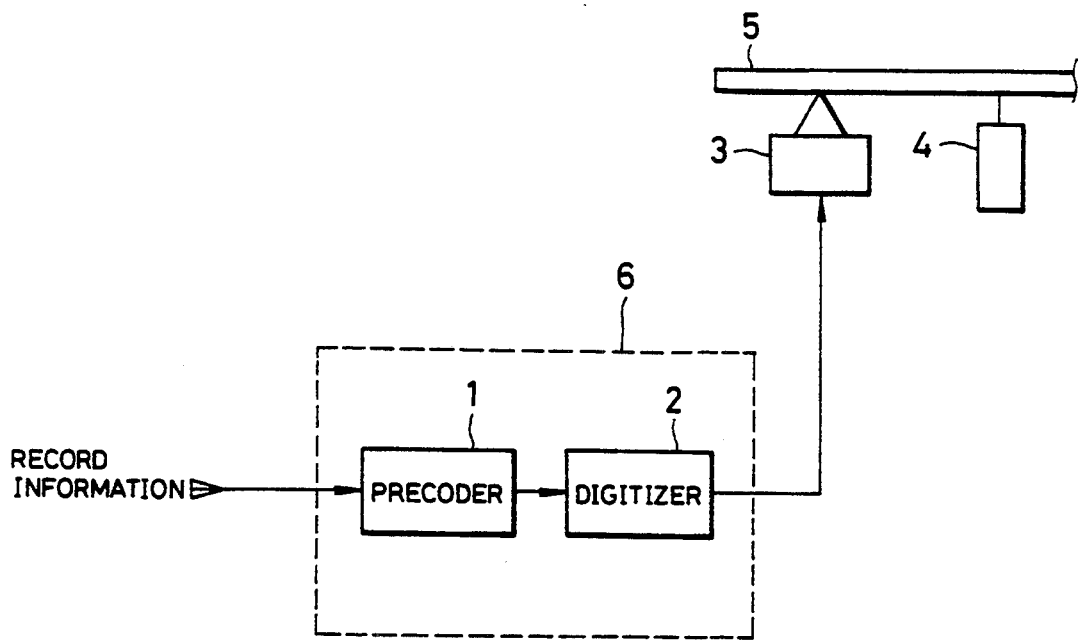
FIGS. 3 and 4 are diagrams illustrating the structures of conventional information recording and reproducing apparatuses using an optical recording medium.
Figure 4:
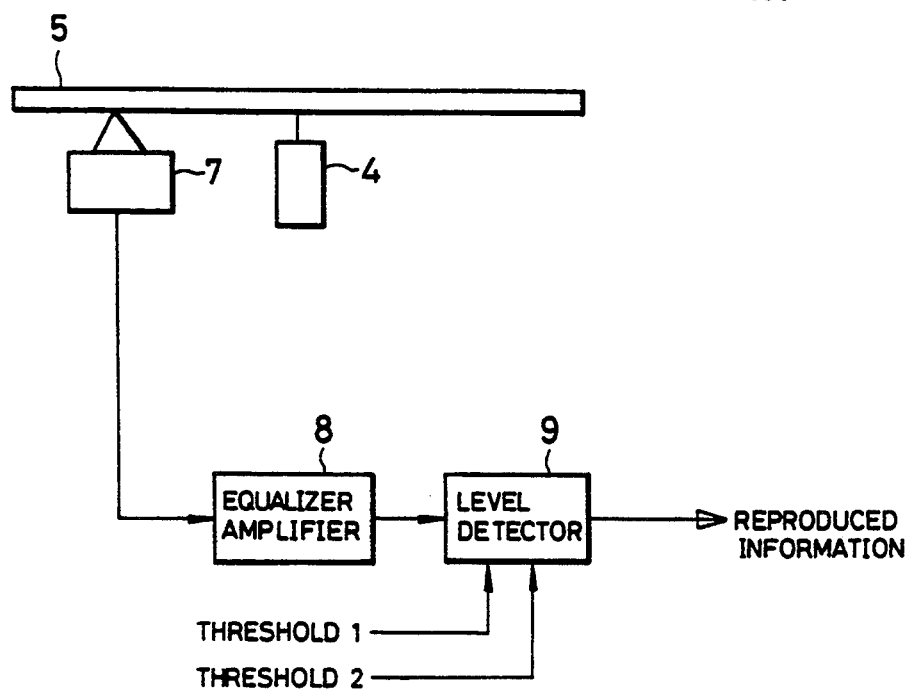
Figure 5:
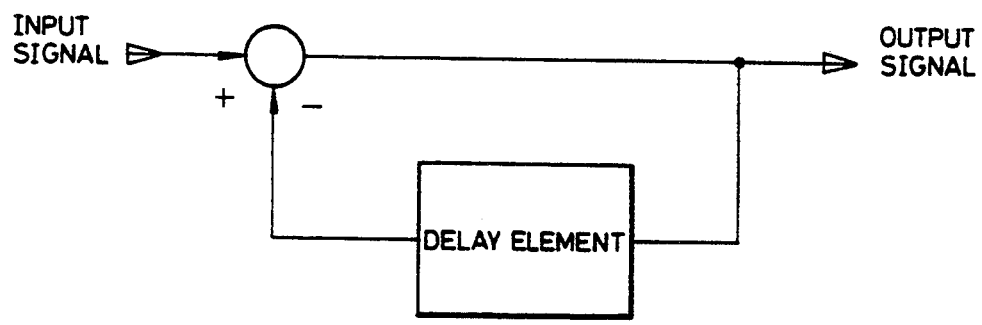
FIG. 5 is a diagram of a precoder.
Figure 6:
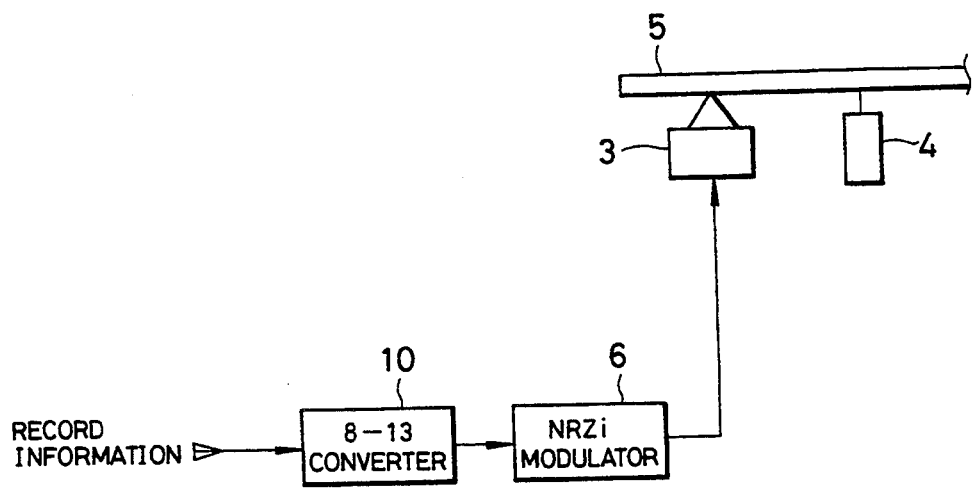
FIGS. 6 and 7 are diagrams illustrating the structures of information recording and reproducing apparatuses using an optical recording medium according to the present invention.
Figure 7:
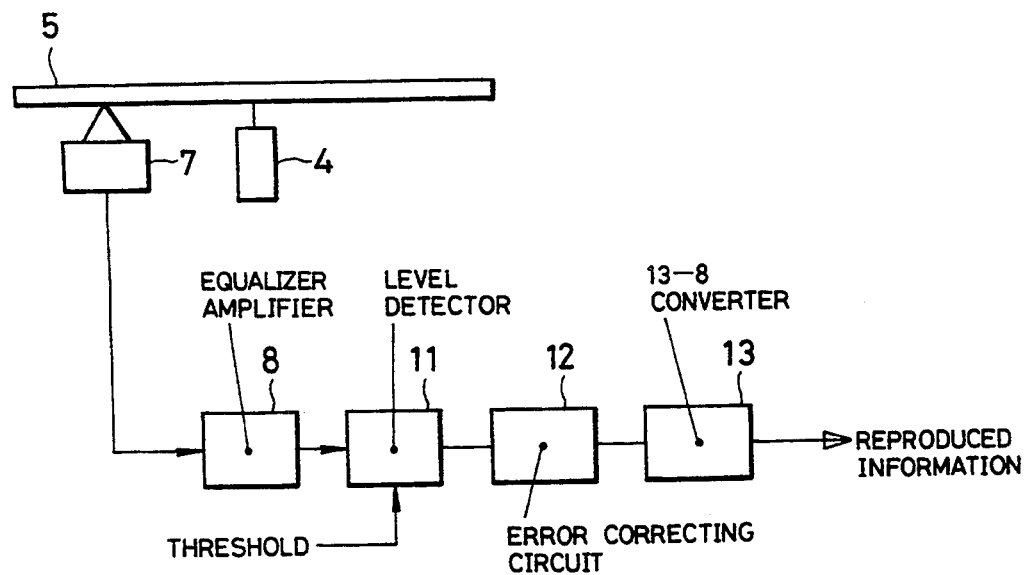

FIGS. 6 and 7 illustrates the structures of the information recording and reproducing apparatuses using an optical recording medium according to the present invention. The information recording and reproducing apparatuses perform information recording and information reproduction in the units of eight bits.

To begin with, in recording information data on an optical disk 5, the information recording apparatus in FIG. 6 embodying the present invention causes an 8-to-13 converter 10 to perform data conversion before NRZi modulation in such a way that "1" will not appear three or more times in a row in a train of information data after the NRZi modulation.

The 8-to-13 converter 10 performs data conversion to expand 8-bit input record information to 13-bit data according to one of the following rules.

Rule (1): A pattern after conversion consists of at least one "0" and an even number of consecutive "1".

Rule (2): A pattern after conversion includes a section consisting of "01010" and a section consisting of at least one "0" or an even number of consecutive "1".

Since the 8-to-13 converter 10 has no output rule to an input, a user needs to arbitrarily prepare output patterns following the above rules, and prepare a data conversion table which associates the output patterns with input data. Tables 1 through 9 show examples of the data conversion table which associates the output patterns with input data. Tables 1 through 7 are prepared according to the rule (1), and tables 8 and 9 according to the rule (2). The 8-to-13 converter 10 may be constituted of a ROM (Read Only Memory) where the output patterns are recorded as data at addresses specified by the input data.

Data after 8-to-13 conversion is supplied to an NRZi modulator 6 to become NRZi data. This NRZi data is then supplied to an optical head 3 to be recorded on an optical disk 5.

TABLE 1

| 8-BIT DATA HEXA- DECI- IMAL NOTA- TION | 13-BIT DATA | | | | | | | | | | | | |
|---|---|---|---|---|---|---|---|---|---|---|---|---|---|
| 00 | 0 | 0 | 1 | 1 | 0 | 0 | 0 | 0 | 0 | 0 | 0 | 0 | 0 |
| 01 | 0 | 0 | 0 | 1 | 1 | 0 | 0 | 0 | 0 | 0 | 0 | 0 | 0 |
| 02 | 0 | 0 | 0 | 0 | 1 | 1 | 0 | 0 | 0 | 0 | 0 | 0 | 0 |
| 03 | 0 | 0 | 0 | 0 | 0 | 1 | 1 | 0 | 0 | 0 | 0 | 0 | 0 |
| 04 | 0 | 0 | 0 | 0 | 0 | 0 | 1 | 1 | 0 | 0 | 0 | 0 | 0 |
| 05 | 0 | 0 | 0 | 0 | 0 | 0 | 0 | 1 | 1 | 0 | 0 | 0 | 0 |
| 06 | 0 | 0 | 0 | 0 | 0 | 0 | 0 | 0 | 1 | 1 | 0 | 0 | 0 |
| 07 | 0 | 0 | 0 | 0 | 0 | 0 | 0 | 0 | 0 | 1 | 1 | 0 | 0 |
| 08 | 1 | 1 | 1 | 1 | 0 | 0 | 0 | 0 | 0 | 0 | 0 | 0 | 0 |
| 09 | 0 | 0 | 1 | 1 | 1 | 1 | 0 | 0 | 0 | 0 | 0 | 0 | 0 |
| 0a | 0 | 0 | 0 | 1 | 1 | 1 | 1 | 0 | 0 | 0 | 0 | 0 | 0 |
| 0b | 0 | 0 | 0 | 0 | 1 | 1 | 1 | 1 | 0 | 0 | 0 | 0 | 0 |
| 0c | 0 | 0 | 0 | 0 | 0 | 1 | 1 | 1 | 1 | 0 | 0 | 0 | 0 |
| 0d | 0 | 0 | 0 | 0 | 0 | 0 | 1 | 1 | 1 | 1 | 0 | 0 | 0 |
| 0e | 0 | 0 | 0 | 0 | 0 | 0 | 0 | 1 | 1 | 1 | 1 | 0 | 0 |
| 0f | 0 | 0 | 0 | 0 | 0 | 0 | 0 | 0 | 1 | 1 | 1 | 1 | 1 |
| 10 | 1 | 1 | 0 | 0 | 1 | 1 | 0 | 0 | 0 | 0 | 0 | 0 | 0 |
| 11 | 1 | 1 | 0 | 0 | 0 | 1 | 1 | 0 | 0 | 0 | 0 | 0 | 0 |
| 12 | 1 | 1 | 0 | 0 | 0 | 0 | 1 | 1 | 0 | 0 | 0 | 0 | 0 |
| 13 | 1 | 1 | 0 | 0 | 0 | 0 | 0 | 1 | 1 | 0 | 0 | 0 | 0 |
| 14 | 1 | 1 | 0 | 0 | 0 | 0 | 0 | 0 | 1 | 1 | 0 | 0 | 0 |
| 15 | 1 | 1 | 0 | 0 | 0 | 0 | 0 | 0 | 0 | 1 | 1 | 0 | 0 |
| 16 | 1 | 1 | 0 | 0 | 0 | 0 | 0 | 0 | 0 | 0 | 0 | 1 | 1 |
| 17 | 0 | 0 | 1 | 1 | 0 | 0 | 1 | 1 | 0 | 0 | 0 | 0 | 0 |
| 18 | 0 | 0 | 1 | 1 | 0 | 0 | 0 | 1 | 1 | 0 | 0 | 0 | 0 |
| 19 | 0 | 0 | 1 | 1 | 0 | 0 | 0 | 1 | 1 | 0 | 0 | 0 | 0 |
| 1a | 0 | 0 | 1 | 1 | 0 | 0 | 0 | 0 | 1 | 1 | 0 | 0 | 0 |
| 1b | 0 | 0 | 1 | 1 | 0 | 0 | 0 | 0 | 0 | 0 | 0 | 1 | 1 |
| 1c | 0 | 0 | 0 | 1 | 1 | 0 | 0 | 1 | 1 | 0 | 0 | 0 | 0 |
| 1d | 0 | 0 | 0 | 1 | 1 | 0 | 0 | 0 | 1 | 1 | 0 | 0 | 0 |
| 1e | 0 | 0 | 0 | 1 | 1 | 0 | 0 | 0 | 0 | 1 | 1 | 0 | 0 |
| 1f | 0 | 0 | 0 | 1 | 1 | 0 | 0 | 0 | 0 | 0 | 0 | 1 | 1 |

TABLE 2

| 8-BIT DATA HEXA- DECI- IMAL NOTA- TION | 13-BIT DATA | | | | | | | | | | | | |
|---|---|---|---|---|---|---|---|---|---|---|---|---|---|
| 20 | 0 | 0 | 0 | 0 | 1 | 1 | 0 | 0 | 1 | 1 | 0 | 0 | 0 |
| 21 | 0 | 0 | 0 | 0 | 1 | 1 | 0 | 0 | 0 | 1 | 1 | 0 | 0 |
| 22 | 0 | 0 | 0 | 0 | 1 | 1 | 0 | 0 | 0 | 0 | 0 | 1 | 1 |
| 23 | 0 | 0 | 0 | 0 | 0 | 1 | 1 | 0 | 0 | 1 | 1 | 0 | 0 |
| 24 | 0 | 0 | 0 | 0 | 0 | 1 | 1 | 0 | 0 | 0 | 0 | 1 | 1 |
| 25 | 0 | 0 | 0 | 0 | 0 | 0 | 1 | 1 | 0 | 0 | 0 | 1 | 1 |
| 26 | 0 | 0 | 0 | 0 | 0 | 0 | 0 | 1 | 1 | 0 | 0 | 1 | 1 |
| 27 | 1 | 1 | 1 | 1 | 1 | 1 | 0 | 0 | 0 | 0 | 0 | 0 | 0 |
| 28 | 0 | 0 | 1 | 1 | 1 | 1 | 1 | 1 | 0 | 0 | 0 | 0 | 0 |
| 29 | 0 | 0 | 0 | 1 | 1 | 1 | 1 | 1 | 1 | 0 | 0 | 0 | 0 |
| 2a | 0 | 0 | 0 | 0 | 1 | 1 | 1 | 1 | 1 | 1 | 0 | 0 | 0 |

TABLE 2-continued

| 8-BIT DATA HEXADECIMAL NOTATION | 13-BIT DATA | | | | | | | | | | | | |
|---|---|---|---|---|---|---|---|---|---|---|---|---|---|
| 2b | 0 | 0 | 0 | 0 | 0 | 1 | 1 | 1 | 1 | 1 | 1 | 0 | 0 |
| 2c | 0 | 0 | 0 | 0 | 0 | 0 | 1 | 1 | 1 | 1 | 1 | 1 | 1 |
| 2d | 1 | 1 | 0 | 0 | 1 | 1 | 1 | 0 | 0 | 0 | 0 | 0 | 1 |
| 2e | 1 | 1 | 0 | 0 | 0 | 1 | 1 | 1 | 1 | 0 | 0 | 0 | 0 |
| 2f | 1 | 1 | 0 | 0 | 0 | 0 | 1 | 1 | 1 | 1 | 0 | 0 | 0 |
| 30 | 1 | 1 | 0 | 0 | 0 | 0 | 0 | 1 | 1 | 1 | 1 | 0 | 0 |
| 31 | 1 | 1 | 0 | 0 | 0 | 0 | 0 | 0 | 0 | 1 | 1 | 1 | 1 |
| 32 | 0 | 0 | 1 | 1 | 0 | 0 | 1 | 1 | 1 | 1 | 0 | 0 | 0 |
| 33 | 0 | 0 | 1 | 1 | 0 | 0 | 0 | 1 | 1 | 1 | 1 | 0 | 0 |
| 34 | 0 | 0 | 1 | 1 | 0 | 0 | 0 | 0 | 0 | 1 | 1 | 1 | 1 |
| 35 | 0 | 0 | 0 | 1 | 1 | 0 | 0 | 1 | 1 | 1 | 1 | 0 | 0 |
| 36 | 0 | 0 | 0 | 1 | 1 | 0 | 0 | 0 | 0 | 1 | 1 | 1 | 1 |
| 37 | 0 | 0 | 0 | 0 | 1 | 1 | 0 | 0 | 0 | 1 | 1 | 1 | 1 |
| 38 | 0 | 0 | 0 | 0 | 0 | 1 | 1 | 0 | 0 | 1 | 1 | 1 | 1 |
| 39 | 1 | 1 | 1 | 1 | 0 | 0 | 1 | 1 | 0 | 0 | 0 | 0 | 0 |
| 3a | 1 | 1 | 1 | 1 | 0 | 0 | 0 | 1 | 1 | 0 | 0 | 0 | 0 |
| 3b | 1 | 1 | 1 | 1 | 0 | 0 | 0 | 0 | 1 | 1 | 0 | 0 | 0 |
| 3c | 1 | 1 | 1 | 1 | 0 | 0 | 0 | 0 | 0 | 1 | 1 | 0 | 0 |
| 3d | 1 | 1 | 1 | 1 | 0 | 0 | 0 | 0 | 0 | 0 | 0 | 1 | 1 |
| 3e | 0 | 0 | 1 | 1 | 1 | 1 | 0 | 0 | 1 | 1 | 0 | 0 | 0 |
| 3f | 0 | 0 | 1 | 1 | 1 | 1 | 0 | 0 | 0 | 1 | 1 | 0 | 0 |

TABLE 3

| 8-BIT DATA HEXADECIMAL NOTATION | 13-BIT DATA | | | | | | | | | | | | |
|---|---|---|---|---|---|---|---|---|---|---|---|---|---|
| 40 | 0 | 0 | 1 | 1 | 1 | 1 | 0 | 0 | 0 | 0 | 0 | 1 | 1 |
| 41 | 0 | 0 | 0 | 1 | 1 | 1 | 1 | 0 | 0 | 1 | 1 | 0 | 0 |
| 42 | 0 | 0 | 0 | 1 | 1 | 1 | 1 | 0 | 0 | 0 | 0 | 1 | 1 |
| 43 | 0 | 0 | 0 | 0 | 1 | 1 | 1 | 1 | 0 | 0 | 1 | 1 | 1 |
| 44 | 0 | 0 | 0 | 0 | 0 | 1 | 1 | 1 | 1 | 0 | 0 | 1 | 1 |
| 45 | 1 | 1 | 0 | 0 | 1 | 1 | 0 | 0 | 1 | 1 | 0 | 0 | 0 |
| 46 | 1 | 1 | 0 | 0 | 1 | 1 | 0 | 0 | 0 | 1 | 1 | 0 | 0 |
| 47 | 1 | 1 | 0 | 0 | 1 | 1 | 0 | 0 | 0 | 0 | 0 | 1 | 1 |
| 48 | 1 | 1 | 0 | 0 | 0 | 1 | 1 | 0 | 0 | 1 | 1 | 0 | 0 |
| 49 | 1 | 1 | 0 | 0 | 0 | 1 | 1 | 0 | 0 | 0 | 0 | 1 | 1 |
| 4a | 1 | 1 | 0 | 0 | 0 | 0 | 1 | 1 | 0 | 0 | 0 | 1 | 1 |
| 4b | 1 | 1 | 0 | 0 | 0 | 0 | 0 | 1 | 1 | 0 | 0 | 1 | 1 |
| 4c | 0 | 0 | 1 | 1 | 0 | 0 | 1 | 1 | 0 | 0 | 0 | 1 | 1 |
| 4d | 0 | 0 | 1 | 1 | 0 | 0 | 0 | 1 | 1 | 0 | 0 | 1 | 1 |
| 4e | 0 | 0 | 0 | 1 | 1 | 0 | 0 | 1 | 1 | 0 | 0 | 1 | 1 |
| 4f | 1 | 1 | 1 | 1 | 1 | 1 | 1 | 0 | 0 | 0 | 0 | 0 | 0 |
| 50 | 0 | 0 | 1 | 1 | 1 | 1 | 1 | 1 | 1 | 0 | 0 | 0 | 0 |
| 51 | 0 | 0 | 0 | 1 | 1 | 1 | 1 | 1 | 1 | 1 | 0 | 0 | 0 |
| 52 | 0 | 0 | 0 | 0 | 0 | 1 | 1 | 1 | 1 | 1 | 1 | 1 | 1 |
| 53 | 1 | 1 | 1 | 1 | 0 | 0 | 1 | 1 | 1 | 0 | 0 | 0 | 0 |
| 54 | 1 | 1 | 1 | 1 | 0 | 0 | 0 | 1 | 1 | 1 | 0 | 0 | 0 |
| 55 | 1 | 1 | 1 | 1 | 0 | 0 | 0 | 0 | 0 | 1 | 1 | 1 | 1 |
| 56 | 0 | 0 | 1 | 1 | 1 | 1 | 0 | 0 | 1 | 1 | 1 | 0 | 0 |
| 57 | 0 | 0 | 0 | 1 | 1 | 1 | 1 | 0 | 0 | 1 | 1 | 1 | 1 |
| 58 | 1 | 1 | 0 | 0 | 1 | 1 | 1 | 1 | 1 | 0 | 0 | 0 | 0 |
| 59 | 1 | 1 | 0 | 0 | 0 | 1 | 1 | 1 | 1 | 1 | 0 | 0 | 0 |
| 5a | 1 | 1 | 0 | 0 | 0 | 0 | 0 | 1 | 1 | 1 | 1 | 1 | 1 |
| 5b | 0 | 0 | 1 | 1 | 0 | 0 | 1 | 1 | 1 | 1 | 1 | 0 | 0 |
| 5c | 0 | 0 | 0 | 1 | 1 | 0 | 1 | 1 | 1 | 1 | 1 | 0 | 0 |
| 5d | 1 | 1 | 1 | 1 | 1 | 0 | 0 | 1 | 1 | 0 | 0 | 0 | 0 |
| 5e | 1 | 1 | 1 | 1 | 1 | 0 | 0 | 0 | 1 | 1 | 0 | 0 | 0 |
| 5f | 1 | 1 | 1 | 1 | 1 | 0 | 0 | 0 | 0 | 0 | 0 | 1 | 1 |

TABLE 4

| 8-BIT DATA HEXADECIMAL NOTATION | 13-BIT DATA | | | | | | | | | | | | |
|---|---|---|---|---|---|---|---|---|---|---|---|---|---|
| 60 | 0 | 0 | 1 | 1 | 1 | 1 | 1 | 1 | 0 | 0 | 0 | 1 | 1 |
| 61 | 0 | 0 | 0 | 1 | 1 | 1 | 1 | 1 | 1 | 0 | 0 | 1 | 1 |
| 62 | 1 | 1 | 0 | 0 | 1 | 1 | 0 | 0 | 0 | 1 | 1 | 1 | 1 |
| 63 | 1 | 1 | 0 | 0 | 0 | 1 | 1 | 0 | 1 | 1 | 1 | 1 | 1 |
| 64 | 1 | 1 | 0 | 1 | 1 | 1 | 1 | 0 | 0 | 0 | 1 | 1 | 1 |
| 65 | 1 | 1 | 0 | 0 | 1 | 1 | 1 | 1 | 0 | 0 | 1 | 1 | 1 |
| 66 | 1 | 1 | 1 | 1 | 0 | 0 | 1 | 1 | 0 | 0 | 0 | 1 | 1 |
| 67 | 1 | 1 | 1 | 1 | 0 | 0 | 0 | 1 | 1 | 0 | 0 | 1 | 1 |
| 68 | 1 | 1 | 1 | 1 | 1 | 1 | 1 | 1 | 1 | 0 | 0 | 0 | 0 |
| 69 | 0 | 0 | 0 | 1 | 1 | 1 | 1 | 1 | 1 | 1 | 1 | 1 | 1 |
| 6a | 1 | 1 | 0 | 0 | 1 | 1 | 1 | 1 | 1 | 1 | 1 | 1 | 1 |
| 6b | 1 | 1 | 1 | 1 | 1 | 1 | 1 | 0 | 0 | 0 | 1 | 1 | 1 |
| 6c | 1 | 1 | 1 | 0 | 0 | 1 | 1 | 1 | 1 | 1 | 1 | 1 | 1 |
| 6d | 1 | 1 | 1 | 1 | 0 | 0 | 0 | 1 | 1 | 1 | 1 | 1 | 1 |
| 6e | 0 | 1 | 1 | 0 | 0 | 0 | 0 | 0 | 0 | 0 | 0 | 0 | 0 |
| 6f | 0 | 0 | 0 | 0 | 0 | 0 | 0 | 0 | 0 | 0 | 1 | 1 | 0 |
| 70 | 0 | 1 | 1 | 1 | 1 | 0 | 0 | 0 | 0 | 0 | 0 | 0 | 0 |
| 71 | 0 | 0 | 0 | 0 | 0 | 0 | 0 | 1 | 1 | 1 | 1 | 1 | 0 |
| 72 | 1 | 1 | 0 | 0 | 0 | 0 | 0 | 0 | 0 | 0 | 1 | 1 | 0 |
| 73 | 0 | 1 | 1 | 0 | 0 | 1 | 1 | 0 | 0 | 0 | 0 | 0 | 0 |
| 74 | 0 | 1 | 1 | 0 | 0 | 0 | 1 | 1 | 0 | 0 | 0 | 0 | 0 |
| 75 | 0 | 1 | 1 | 0 | 0 | 0 | 0 | 1 | 1 | 0 | 0 | 0 | 0 |
| 76 | 0 | 1 | 1 | 0 | 0 | 0 | 0 | 0 | 1 | 1 | 0 | 0 | 0 |
| 77 | 0 | 1 | 1 | 0 | 0 | 0 | 0 | 0 | 0 | 1 | 1 | 0 | 0 |
| 78 | 0 | 1 | 1 | 0 | 0 | 0 | 0 | 0 | 0 | 0 | 1 | 1 | 0 |
| 79 | 0 | 1 | 1 | 0 | 0 | 0 | 0 | 0 | 0 | 0 | 0 | 1 | 1 |
| 7a | 0 | 0 | 1 | 1 | 0 | 1 | 1 | 0 | 0 | 0 | 0 | 0 | 0 |
| 7b | 0 | 0 | 1 | 1 | 0 | 0 | 0 | 0 | 0 | 0 | 1 | 1 | 0 |
| 7c | 0 | 0 | 0 | 1 | 1 | 0 | 1 | 1 | 0 | 0 | 0 | 0 | 0 |
| 7d | 0 | 0 | 1 | 1 | 0 | 0 | 0 | 0 | 0 | 0 | 1 | 1 | 0 |
| 7e | 0 | 0 | 0 | 1 | 1 | 0 | 1 | 1 | 0 | 0 | 0 | 0 | 0 |
| 7f | 0 | 0 | 0 | 1 | 1 | 0 | 0 | 0 | 0 | 1 | 1 | 0 | 0 |

TABLE 5

| 8-BIT DATA HEXADECIMAL NOTATION | 13-BIT DATA | | | | | | | | | | | | |
|---|---|---|---|---|---|---|---|---|---|---|---|---|---|
| 80 | 0 | 0 | 0 | 0 | 0 | 1 | 1 | 0 | 1 | 1 | 0 | 0 | 0 |
| 81 | 0 | 0 | 0 | 0 | 0 | 1 | 1 | 0 | 0 | 1 | 1 | 1 | 0 |
| 82 | 0 | 0 | 0 | 0 | 0 | 0 | 1 | 1 | 0 | 1 | 1 | 0 | 0 |
| 83 | 0 | 0 | 0 | 0 | 0 | 1 | 1 | 0 | 0 | 1 | 1 | 0 | 0 |
| 84 | 0 | 1 | 1 | 1 | 1 | 1 | 1 | 0 | 0 | 0 | 0 | 0 | 0 |
| 85 | 0 | 0 | 0 | 0 | 0 | 1 | 1 | 1 | 1 | 1 | 1 | 1 | 0 |
| 86 | 1 | 1 | 0 | 0 | 0 | 0 | 0 | 1 | 1 | 1 | 1 | 0 | 0 |
| 87 | 0 | 1 | 1 | 0 | 0 | 1 | 1 | 1 | 1 | 0 | 0 | 0 | 0 |
| 88 | 0 | 1 | 1 | 0 | 0 | 0 | 1 | 1 | 1 | 1 | 0 | 0 | 0 |
| 89 | 0 | 1 | 1 | 0 | 0 | 0 | 0 | 1 | 1 | 1 | 1 | 0 | 0 |
| 8a | 0 | 1 | 1 | 0 | 0 | 0 | 0 | 0 | 1 | 1 | 1 | 1 | 0 |
| 8b | 0 | 1 | 1 | 0 | 0 | 0 | 0 | 0 | 0 | 1 | 1 | 1 | 1 |
| 8c | 0 | 0 | 1 | 1 | 0 | 1 | 1 | 1 | 1 | 0 | 0 | 0 | 0 |
| 8d | 0 | 0 | 1 | 1 | 0 | 0 | 1 | 1 | 1 | 1 | 1 | 0 | 0 |
| 8e | 0 | 0 | 0 | 1 | 1 | 0 | 1 | 1 | 1 | 1 | 0 | 0 | 0 |
| 8f | 0 | 0 | 0 | 1 | 1 | 0 | 0 | 1 | 1 | 1 | 1 | 1 | 0 |
| 90 | 0 | 0 | 0 | 0 | 1 | 1 | 0 | 1 | 1 | 1 | 1 | 0 | 0 |
| 91 | 0 | 0 | 0 | 0 | 1 | 1 | 0 | 0 | 1 | 1 | 1 | 1 | 0 |
| 92 | 1 | 1 | 1 | 0 | 0 | 0 | 0 | 0 | 0 | 1 | 1 | 0 | 0 |
| 93 | 0 | 1 | 1 | 1 | 1 | 0 | 1 | 1 | 0 | 0 | 0 | 0 | 0 |
| 94 | 0 | 1 | 1 | 1 | 1 | 0 | 0 | 1 | 1 | 0 | 0 | 0 | 0 |
| 95 | 0 | 1 | 1 | 1 | 1 | 0 | 0 | 0 | 1 | 1 | 0 | 0 | 0 |
| 96 | 0 | 1 | 1 | 1 | 1 | 0 | 0 | 0 | 0 | 1 | 1 | 0 | 0 |
| 97 | 0 | 1 | 1 | 1 | 1 | 0 | 0 | 0 | 0 | 0 | 0 | 1 | 1 |
| 98 | 0 | 0 | 1 | 1 | 1 | 1 | 0 | 0 | 1 | 1 | 0 | 0 | 0 |
| 99 | 0 | 0 | 0 | 1 | 1 | 1 | 1 | 0 | 0 | 1 | 1 | 0 | 0 |
| 9a | 0 | 0 | 0 | 1 | 1 | 1 | 1 | 0 | 0 | 0 | 1 | 1 | 0 |
| 9b | 1 | 1 | 0 | 1 | 1 | 0 | 1 | 1 | 0 | 0 | 0 | 0 | 0 |
| 9c | 1 | 1 | 0 | 1 | 1 | 0 | 0 | 1 | 1 | 0 | 0 | 0 | 0 |
| 9d | 1 | 1 | 0 | 0 | 1 | 1 | 0 | 1 | 1 | 0 | 0 | 0 | 0 |
| 9e | 1 | 1 | 0 | 0 | 1 | 1 | 0 | 0 | 0 | 1 | 1 | 0 | 0 |

TABLE 5-continued

| 8-BIT DATA HEXADECIMAL NOTATION | 13-BIT DATA | | | | | | | | | | | | |
|---|---|---|---|---|---|---|---|---|---|---|---|---|---|
| 9f | 1 | 1 | 0 | 0 | 0 | 0 | 1 | 1 | 0 | 1 | 1 | 0 | 0 |

TABLE 6

| 8-BIT DATA HEXADECIMAL NOTATION | 13-BIT DATA | | | | | | | | | | | | |
|---|---|---|---|---|---|---|---|---|---|---|---|---|---|
| a0 | 1 | 1 | 0 | 0 | 0 | 0 | 1 | 1 | 0 | 0 | 1 | 1 | 0 |
| a1 | 0 | 1 | 1 | 0 | 0 | 1 | 1 | 0 | 1 | 1 | 0 | 0 | 0 |
| a2 | 0 | 1 | 1 | 0 | 0 | 1 | 1 | 0 | 0 | 1 | 1 | 0 | 0 |
| a3 | 0 | 1 | 1 | 0 | 0 | 1 | 1 | 0 | 0 | 0 | 1 | 1 | 0 |
| a4 | 0 | 1 | 1 | 0 | 0 | 1 | 1 | 0 | 0 | 0 | 1 | 1 | 1 |
| a5 | 0 | 1 | 1 | 0 | 0 | 0 | 1 | 1 | 0 | 1 | 1 | 0 | 0 |
| a6 | 0 | 1 | 1 | 0 | 0 | 0 | 1 | 1 | 0 | 0 | 1 | 1 | 0 |
| a7 | 0 | 1 | 1 | 0 | 0 | 0 | 1 | 1 | 0 | 0 | 1 | 1 | 1 |
| a8 | 0 | 1 | 1 | 0 | 0 | 0 | 0 | 1 | 1 | 0 | 0 | 1 | 1 |
| a9 | 0 | 0 | 1 | 1 | 0 | 1 | 1 | 0 | 0 | 1 | 1 | 0 | 0 |
| aa | 0 | 0 | 1 | 1 | 0 | 1 | 1 | 0 | 0 | 0 | 1 | 1 | 0 |
| ab | 0 | 0 | 1 | 1 | 0 | 1 | 1 | 0 | 0 | 0 | 1 | 1 | 1 |
| ac | 0 | 0 | 1 | 1 | 0 | 0 | 1 | 1 | 0 | 1 | 1 | 0 | 0 |
| ad | 0 | 0 | 1 | 1 | 0 | 0 | 1 | 1 | 0 | 0 | 1 | 1 | 0 |
| ae | 0 | 0 | 0 | 1 | 1 | 0 | 1 | 1 | 0 | 0 | 1 | 1 | 0 |
| af | 0 | 0 | 0 | 1 | 1 | 0 | 1 | 1 | 0 | 0 | 0 | 1 | 1 |
| b0 | 0 | 0 | 0 | 0 | 1 | 1 | 0 | 1 | 1 | 0 | 0 | 1 | 1 |
| b1 | 0 | 1 | 1 | 1 | 1 | 1 | 1 | 1 | 0 | 0 | 0 | 0 | 0 |
| b2 | 0 | 0 | 0 | 1 | 1 | 1 | 1 | 1 | 1 | 1 | 1 | 0 | 0 |
| b3 | 1 | 1 | 1 | 1 | 0 | 0 | 0 | 0 | 1 | 1 | 1 | 1 | 0 |
| b4 | 0 | 1 | 1 | 1 | 1 | 0 | 0 | 1 | 1 | 1 | 1 | 0 | 0 |
| b5 | 0 | 1 | 1 | 1 | 1 | 0 | 0 | 0 | 1 | 1 | 1 | 1 | 0 |
| b6 | 0 | 1 | 1 | 1 | 1 | 0 | 0 | 0 | 1 | 1 | 1 | 1 | 1 |
| b7 | 0 | 0 | 1 | 1 | 1 | 1 | 0 | 0 | 1 | 1 | 1 | 1 | 0 |
| b8 | 1 | 1 | 0 | 0 | 0 | 1 | 1 | 1 | 1 | 1 | 1 | 1 | 0 |
| b9 | 0 | 1 | 1 | 0 | 0 | 1 | 1 | 1 | 1 | 1 | 1 | 0 | 0 |
| ba | 0 | 1 | 1 | 0 | 0 | 0 | 1 | 1 | 1 | 1 | 1 | 1 | 0 |
| bb | 0 | 1 | 1 | 0 | 0 | 0 | 0 | 1 | 1 | 1 | 1 | 1 | 1 |
| bc | 0 | 0 | 1 | 1 | 0 | 1 | 1 | 1 | 1 | 1 | 1 | 0 | 0 |
| bd | 0 | 0 | 1 | 1 | 0 | 0 | 1 | 1 | 1 | 1 | 1 | 1 | 0 |
| be | 1 | 1 | 1 | 1 | 1 | 1 | 0 | 0 | 0 | 0 | 1 | 1 | 0 |
| bf | 0 | 1 | 1 | 1 | 1 | 1 | 1 | 0 | 0 | 1 | 1 | 0 | 0 |

TABLE 7

| 8-BIT DATA HEXADECIMAL NOTATION | 13-BIT DATA | | | | | | | | | | | | |
|---|---|---|---|---|---|---|---|---|---|---|---|---|---|
| c0 | 0 | 1 | 1 | 1 | 1 | 1 | 1 | 0 | 0 | 0 | 1 | 1 | 0 |
| c1 | 0 | 1 | 1 | 1 | 1 | 1 | 1 | 0 | 0 | 0 | 0 | 1 | 1 |
| c2 | 0 | 0 | 1 | 1 | 1 | 1 | 1 | 0 | 0 | 1 | 1 | 0 | 0 |
| c3 | 1 | 1 | 0 | 0 | 1 | 1 | 0 | 1 | 1 | 1 | 1 | 0 | 0 |
| c4 | 1 | 1 | 0 | 0 | 1 | 1 | 0 | 0 | 1 | 1 | 1 | 1 | 0 |
| c5 | 0 | 1 | 1 | 0 | 0 | 1 | 1 | 0 | 0 | 1 | 1 | 1 | 1 |
| c6 | 0 | 0 | 1 | 1 | 0 | 1 | 1 | 0 | 0 | 1 | 1 | 1 | 1 |
| c7 | 1 | 1 | 0 | 0 | 1 | 1 | 1 | 0 | 0 | 1 | 1 | 1 | 0 |
| c8 | 0 | 1 | 1 | 0 | 0 | 1 | 1 | 1 | 1 | 0 | 0 | 1 | 1 |
| c9 | 0 | 0 | 1 | 1 | 0 | 1 | 1 | 1 | 1 | 0 | 0 | 1 | 1 |
| ca | 1 | 1 | 1 | 0 | 0 | 1 | 1 | 0 | 1 | 1 | 0 | 0 | 0 |
| cb | 1 | 1 | 1 | 1 | 0 | 0 | 1 | 0 | 0 | 1 | 1 | 0 | 0 |
| cc | 0 | 1 | 1 | 1 | 1 | 0 | 0 | 1 | 0 | 0 | 1 | 1 | 1 |
| cd | 1 | 1 | 0 | 0 | 1 | 1 | 0 | 1 | 1 | 0 | 0 | 1 | 1 |
| ce | 0 | 1 | 1 | 1 | 1 | 1 | 1 | 1 | 1 | 1 | 1 | 0 | 0 |
| cf | 0 | 0 | 1 | 1 | 1 | 1 | 1 | 1 | 1 | 1 | 1 | 1 | 0 |
| d0 | 1 | 1 | 0 | 0 | 1 | 1 | 1 | 1 | 1 | 1 | 1 | 1 | 0 |
| d1 | 0 | 1 | 1 | 0 | 0 | 1 | 1 | 1 | 1 | 1 | 1 | 1 | 1 |
| d2 | 1 | 1 | 1 | 1 | 1 | 1 | 1 | 1 | 0 | 0 | 1 | 1 | 0 |

TABLE 7-continued

| 8-BIT DATA HEXADECIMAL NOTATION | 13-BIT DATA | | | | | | | | | | | | |
|---|---|---|---|---|---|---|---|---|---|---|---|---|---|
| d3 | 0 | 1 | 1 | 1 | 1 | 1 | 1 | 1 | 1 | 0 | 0 | 1 | 1 |
| d4 | 1 | 1 | 1 | 1 | 0 | 0 | 1 | 1 | 1 | 1 | 1 | 1 | 0 |
| d5 | 0 | 1 | 1 | 1 | 1 | 0 | 0 | 1 | 1 | 1 | 1 | 1 | 1 |
| d6 | 1 | 1 | 1 | 1 | 1 | 1 | 0 | 0 | 1 | 1 | 1 | 1 | 0 |
| d7 | 0 | 1 | 1 | 1 | 1 | 1 | 1 | 0 | 0 | 1 | 1 | 1 | 1 |

TABLE 8

| 8-BIT DATA HEXADECIMAL NOTATION | 13-BIT DATA | | | | | | | | | | | | |
|---|---|---|---|---|---|---|---|---|---|---|---|---|---|
| d8 | 0 | 0 | 1 | 0 | 1 | 0 | 0 | 0 | 0 | 0 | 0 | 0 | 0 |
| d9 | 0 | 0 | 0 | 1 | 0 | 1 | 0 | 0 | 0 | 0 | 0 | 0 | 0 |
| da | 0 | 0 | 0 | 0 | 1 | 0 | 1 | 0 | 0 | 0 | 0 | 0 | 0 |
| db | 0 | 0 | 0 | 0 | 0 | 1 | 0 | 1 | 0 | 0 | 0 | 0 | 0 |
| dc | 0 | 0 | 0 | 0 | 0 | 0 | 1 | 0 | 1 | 0 | 0 | 0 | 0 |
| dd | 0 | 0 | 0 | 0 | 0 | 0 | 0 | 1 | 0 | 1 | 0 | 0 | 0 |
| de | 1 | 1 | 0 | 0 | 1 | 0 | 1 | 0 | 0 | 0 | 0 | 0 | 0 |
| df | 1 | 1 | 0 | 0 | 0 | 1 | 0 | 1 | 0 | 0 | 0 | 0 | 0 |
| e0 | 1 | 1 | 0 | 0 | 0 | 0 | 1 | 0 | 1 | 0 | 0 | 0 | 0 |
| e1 | 1 | 1 | 0 | 0 | 0 | 0 | 0 | 1 | 0 | 1 | 0 | 0 | 0 |
| e2 | 0 | 1 | 1 | 0 | 0 | 1 | 0 | 1 | 0 | 0 | 0 | 0 | 0 |
| e3 | 0 | 1 | 1 | 0 | 0 | 0 | 1 | 0 | 1 | 0 | 0 | 0 | 0 |
| e4 | 0 | 1 | 1 | 0 | 0 | 0 | 0 | 1 | 0 | 1 | 0 | 0 | 0 |
| e5 | 0 | 0 | 1 | 1 | 0 | 0 | 1 | 0 | 1 | 0 | 0 | 0 | 0 |
| e6 | 0 | 0 | 1 | 1 | 0 | 0 | 0 | 1 | 0 | 1 | 0 | 0 | 0 |
| e7 | 0 | 0 | 0 | 1 | 1 | 0 | 0 | 1 | 0 | 1 | 0 | 0 | 0 |
| e8 | 0 | 0 | 1 | 0 | 1 | 0 | 0 | 1 | 1 | 0 | 0 | 0 | 0 |
| e9 | 0 | 0 | 1 | 0 | 1 | 0 | 0 | 0 | 1 | 1 | 0 | 0 | 0 |
| ea | 0 | 0 | 1 | 0 | 1 | 0 | 0 | 0 | 0 | 1 | 1 | 0 | 0 |
| eb | 0 | 0 | 1 | 0 | 1 | 0 | 0 | 0 | 0 | 0 | 1 | 1 | 0 |
| ec | 0 | 0 | 1 | 0 | 1 | 0 | 0 | 0 | 0 | 0 | 0 | 1 | 1 |
| ed | 0 | 0 | 0 | 1 | 0 | 1 | 0 | 0 | 1 | 1 | 0 | 0 | 0 |
| ee | 0 | 0 | 0 | 1 | 0 | 1 | 0 | 0 | 0 | 1 | 1 | 0 | 0 |
| ef | 0 | 0 | 0 | 1 | 0 | 1 | 0 | 0 | 0 | 0 | 1 | 1 | 0 |
| f0 | 0 | 0 | 0 | 1 | 0 | 1 | 0 | 0 | 0 | 0 | 0 | 1 | 1 |
| f1 | 0 | 0 | 0 | 0 | 1 | 0 | 1 | 0 | 0 | 1 | 1 | 0 | 0 |
| f2 | 0 | 0 | 0 | 0 | 1 | 0 | 1 | 0 | 0 | 0 | 1 | 1 | 0 |
| f3 | 0 | 0 | 0 | 0 | 1 | 0 | 1 | 0 | 0 | 0 | 0 | 1 | 1 |
| f4 | 0 | 0 | 0 | 0 | 0 | 1 | 0 | 1 | 0 | 0 | 1 | 1 | 0 |
| f5 | 0 | 0 | 0 | 0 | 0 | 1 | 0 | 1 | 0 | 0 | 0 | 1 | 1 |
| f6 | 0 | 0 | 0 | 0 | 0 | 0 | 1 | 0 | 1 | 0 | 0 | 1 | 1 |

TABLE 9

| 8-BIT DATA HEXADECIMAL NOTATION | 13-BIT DATA | | | | | | | | | | | | |
|---|---|---|---|---|---|---|---|---|---|---|---|---|---|
| f7 | 1 | 1 | 1 | 1 | 0 | 0 | 1 | 0 | 1 | 0 | 0 | 0 | 0 |
| f8 | 1 | 1 | 1 | 1 | 0 | 0 | 0 | 1 | 0 | 1 | 0 | 0 | 0 |
| f9 | 0 | 1 | 1 | 1 | 1 | 0 | 0 | 1 | 0 | 1 | 0 | 0 | 0 |
| fa | 0 | 0 | 1 | 0 | 1 | 0 | 0 | 1 | 1 | 1 | 1 | 0 | 0 |
| fb | 0 | 0 | 1 | 0 | 1 | 0 | 0 | 0 | 1 | 1 | 1 | 1 | 0 |
| fc | 0 | 0 | 1 | 0 | 1 | 0 | 0 | 0 | 0 | 1 | 1 | 1 | 1 |
| fd | 0 | 0 | 0 | 1 | 0 | 1 | 0 | 0 | 1 | 1 | 1 | 1 | 0 |
| fe | 0 | 0 | 0 | 1 | 0 | 1 | 0 | 0 | 0 | 1 | 1 | 1 | 1 |
| ff | 0 | 0 | 0 | 0 | 1 | 0 | 1 | 0 | 0 | 1 | 1 | 1 | 1 |

A description will now be given of the information reproducing apparatus in FIG. 7 according to the present invention. An optical pickup 7 picks up information from the optical disk 5 and supplies the acquired reproduced signal to an equalizer amplifier 8. The reproduced signal amplified by the equalizer amplifier 8 is sent to a level detector 11. The level detector 11 compares the level of the signal from the equalizer amplifier 8 with a threshold level as a reference for level discrimination to acquire digital data from the reproduced signal. The level detector 11 sends digital data of "0" to an error correcting circuit 12 when the level of the signal from the equalizer amplifier 8 is lower than the threshold level, and sends digital data of "1" to the error correcting circuit 12 when that signal level is equal to or higher than the threshold level. When a sequence of "01110" is present in the received 13-bit data, the error correcting circuit 12 corrects it to "01010" and sends the corrected data to a 13-to-8 converter 13. When the received 13-bit data does not contain a sequence of "01110," the error correcting circuit 12 performs no error correction and sends the received data directly to the 13-to-8 converter 13. The 13-to-8 converter 13 refers to the data conversion table in the reverse manner to the one done by the 8-to-13 converter 10 to convert 13-bit data to 8-bit data, and outputs the resultant data as reproduced information.

The following will discuss data transition, referring to actual data input to the information recording/reproducing apparatus of the present invention. In this description Tables 1 through 9 are to be referred to as data conversion tables for 8-to-13 conversion.

First, data transition at the time of information recording/reproduction when 8-to-13 conversion which conforms to the aforementioned rule (1) will be described.

When record information is "01111010" ("7A" in hexadecimal notation), data after 8-to-13 conversion becomes "0011011000000" from Table 4. When this data is subjected to NRZi modulation, it becomes "0010010000000" which is in turn recorded on the optical disk 5. At the time of information reproduction, data "0010010000000" becomes "0011011000000" due to code interference. As a sequence of "01110" does not appear in this data, "0011011000000" is directly subjected to 13-to-8 conversion. In the 13-to-8 conversion, the data conversion table (Table 4) is referred to in the reverse manner to what is done in the 8-to-13 conversion, so that "01111010" is output as reproduced information.

Next, data transition at the time of information recording/reproduction when 8-to-13 conversion conforming to the aforementioned rule (2) will be described.

When record information is "11101000" ("E8" in hexadecimal notation), data after 8-to-13 conversion becomes "0010100110000" from Table 8. When this data is subjected to NRZi modulation, it becomes "0011000100000" which is in turn recorded on the optical disk 5. At the time of information reproduction, data "0011000100000" becomes "0012100110000" due to code interference. Since a single threshold level is used in the detection of the level of the reproduced signal and all the levels above "1" are set to "1" in the present invention, that data actually becomes "0011100110000." As a sequence of "01110" exists in this data, the data is corrected to "0010100110000" which is in turn subjected to 13-to-8 conversion. In the 13-to-8 conversion, the data conversion table (Table 8) is referred to in the reverse manner to what is done in the 8-to-13 conversion, so that "11101000" is output as reproduced information.

The numbers of bits, "8" and "13", in the 8-to-13 conversion and 13-to-8 conversion are determined for the apparatuses according to this embodiment, which perform information recording and reduction in the units of 8 bits, but those numbers may be arbitrarily determined by a user as long as they satisfy the rules (1) and (2).

The information recording/reproducing apparatus using an optical recording medium according to the present invention inhibits "1" from consecutively appearing in data or performs data conversion to restrict the number of consecutive appearing "1" to two at a maximum before recording record information on a disk. In detecting the level of the reproduced signal, therefore, two values "0" and "1" have only to be detected, so that the reproduced signal does not require a S/N ratio higher than that acquired by the conventional apparatus which detects three values of level, "0", "1" and "2". The present invention can therefore provide an information recording/reproducing apparatus for an optical recording medium designed to have a high linear recording density.

What is claimed is:

1. An information recording apparatus using an optical recording medium comprising:

a data converting means for performing data conversion on record information consisting of a digital signal in accordance with a predetermined data conversion table including a pattern for yielding a converted pattern consisting of one of at least one "0" and an even number of consecutive "1's" and a converted pattern having a section consisting of "01010" and a section consisting of one of at least one "0" and an even number of consecutive "1's";

a data modulating means for inverting an initial output signal when bit information of data after said data conversion is "1" given that an initial output signal is "0", wherein said data conversion is performed on said digital signal before supplying said digital signal to said data modulating means so that an output signal from said data modulating means always includes no more than two consecutive "1's"; and a recording means for recording said output signal on said optical recording medium.

2. An information reproducing apparatus for an optical recording medium on which information is recorded by the information recording apparatus as recited in claim 1, the information reproducing apparatus comprising:

a reading means for reading information from said optical recording medium to yield a reproduced signal;

a level detecting means for detecting a level of said reproduced signal and outputting digital data;

an error correcting means for detecting a sequence of "01110" in a bit pattern of said digital data and for correcting the sequence to a sequence of "01010" and outputting corrected data, and, upon detection of no error, outputting the digital data; and a data reverse converting means for performing reverse conversion of output data of said error correcting means in accordance with the data conversion table, yielding reproduced information;

wherein said error correcting means ensures that said reproduced signal always includes no more than two consecutive "1's".

* * * * *